US008508898B2

(12) United States Patent
Burnham et al.

(10) Patent No.: US 8,508,898 B2
(45) Date of Patent: Aug. 13, 2013

(54) DIAGNOSABLE REVERSE-VOLTAGE PROTECTION FOR HIGH POWER LOADS

(75) Inventors: David Burnham, Berkley, MI (US); Michael R. Meier, Walled Lake, MI (US)

(73) Assignee: Robert Bosch GmbH, Stuttgart (DE)

( * ) Notice: Subject to any disclaimer, the term of this patent is extended or adjusted under 35 U.S.C. 154(b) by 88 days.

(21) Appl. No.: 13/348,315

(22) Filed: Jan. 11, 2012

(65) Prior Publication Data

US 2013/0176651 A1      Jul. 11, 2013

(51) Int. Cl.
     *H02H 3/00*     (2006.01)
(52) U.S. Cl.
     USPC ............................................ 361/86; 361/84
(58) Field of Classification Search
     USPC ........................................ 361/86, 84
     See application file for complete search history.

(56) References Cited

U.S. PATENT DOCUMENTS

| 5,517,379 | A | 5/1996 | Williams et al. |
| 5,539,610 | A | 7/1996 | Williams et al. |
| 5,642,251 | A * | 6/1997 | Lebbolo et al. ............... 361/84 |
| 6,043,965 | A | 3/2000 | Hazelton et al. |
| 6,060,943 | A | 5/2000 | Jansen |
| 6,154,081 | A | 11/2000 | Pakkala et al. |
| 6,724,593 | B1 * | 4/2004 | Smith ............................ 361/84 |
| 7,327,157 | B2 | 2/2008 | Hackner |
| 2002/0118497 | A1 * | 8/2002 | Petruska ........................ 361/23 |
| 2010/0073082 | A1 | 3/2010 | Takeshita et al. |
| 2010/0263960 | A1 | 10/2010 | Nagase |

FOREIGN PATENT DOCUMENTS

WO      9530155      11/1995

OTHER PUBLICATIONS

International Search Report and Written Opinion for Application No. PCT/US2013/020201 dated Apr. 29, 2013 (12 pages).

* cited by examiner

*Primary Examiner* — Scott Bauer
(74) *Attorney, Agent, or Firm* — Michael Best & Friedrich LLP

(57) ABSTRACT

Systems and methods of diagnosing a condition of a reverse-voltage protection switch in an electric system. The electric system includes a power source, an electric load, and a reverse-voltage protection switch in a series-type configuration. The electric system further includes a ground switch configured to selectively connect the source terminal of the reverse-voltage protection circuit to ground. The terminals of the reverse-voltage protection circuit are disconnected from the power source. The ground switch is closed to connect one terminal of the reverse-voltage protection switch to ground. A bias voltage is applied to the other terminal of the reverse-voltage protection switch and the reverse-voltage protection switch is opened. An improper short-circuit condition across the reverse-voltage protection switch is detected when the voltage at the biased terminal of the reverse-voltage protection switch is less than a threshold when the reverse-voltage protection switch is opened.

12 Claims, 4 Drawing Sheets

DIAGNOSABLE REVERSE-VOLTAGE PROTECTION FOR HIGH POWER LOADS

BACKGROUND

The present invention relates to systems and methods for protecting an electrical device during a reverse application of a battery. When a battery is connected improperly, it is possible for the reverse current to damage an electrical device.

SUMMARY

The systems and methods described below provide a system for protecting an electrical device by preventing a reverse current from flowing through the circuit when a battery or other power source is connected improperly. In particular, systems described below provide protection for high-power electrical loads that are controlled using both a high-side switch and a low-side switch. The circuit includes a controllable reverse-voltage protection (RVP) switch that prevents the reverse voltage from being applied to the load and also can be controlled to diagnose hardware failures in the protection circuit.

Among other things, the invention provides an electric system including a power source and an electric load operated by the power source. A reverse-voltage protection switch is connected in a series-type configuration between the load and the power source, and prevents a reverse voltage from being applied to the electric load. The reverse-voltage protection switch includes a control terminal, a first terminal (e.g., a source), and a second terminal (e.g., a drain). The electric system also includes a reverse-voltage protection diagnostics circuit including a ground switch connected between the first terminal of the reverse-voltage protection switch and the load, a controllable bias voltage source connected to the second terminal of the reverse-voltage protection switch, and a control system. The control system is configured to detect error conditions in the reverse-voltage protection switch by disconnecting the second terminal of the reverse-voltage protection switch from the power source, opening the reverse-voltage protection switch, closing the ground switch, applying a bias voltage from the bias voltage source, and determining that there is an improper short-circuit across the reverse-voltage protection switch if the voltage at the second terminal of the reverse-voltage protection switch is less than a threshold.

The control system is further configured, in certain embodiments, to detect error conditions in the reverse-voltage protection switch by disconnecting the second terminal of the reverse-voltage protection switch from the power source, closing the reverse-voltage protection switch, closing the ground switch, applying a bias voltage from the bias voltage source, and determining that there is an improper open-circuit condition across the reverse-voltage protection switch when the voltage at the second terminal of the reverse-voltage protection switch is greater than a threshold.

In some embodiments, the electric system includes a high-side control switch connected in a series-type configuration between the electric load and the power source and a low-side control switch connected in a series-type configuration between the second terminal of the reverse-voltage protection switch and the power source. The reverse-voltage protection switch is connected in a series-type configuration between the electric load and the low-side control switch.

In another embodiment, the invention provides a method of diagnosing a condition of a reverse-voltage protection switch in an electric system. The electric system includes a power source, an electric load, and a reverse-voltage protection switch in a series-type configuration. The electric system further includes a ground switch configured to selectively connect a first terminal of the reverse-voltage protection circuit to ground. The method includes the acts of disconnecting a second terminal of the reverse-voltage protection circuit from the power source, closing the ground switch to connect the first terminal of the reverse-voltage protection switch to ground, applying the bias voltage to the second terminal of the reverse-voltage protection switch, opening the reverse-voltage protection switch, and determining that there is an improper short-circuit condition across the reverse-voltage protection switch when the voltage at the second terminal of the reverse-voltage protection switch is less than a threshold.

In some embodiments, the method further includes the acts of disconnecting the second terminal of the reverse-voltage protection circuit from the power source, closing the ground switch to connect the first terminal of the reverse-voltage protection switch to ground, applying the bias voltage to the second terminal of the reverse-voltage protection switch, closing the reverse-voltage protection switch, and determining that there is an improper open-circuit condition across the reverse-voltage protection switch when the voltage at the second terminal of the reverse-voltage protection switch is less than a threshold.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Direct-current (DC) electrical systems, including electromechanical systems such as motors, are typically designed such that current from a power source is to be applied in a particular direction. When power source is connected improperly, such that the terminals of the battery are connected backwards, a reverse current/reverse voltage is applied to the electrical system. This reverse voltage can damage the electrical system.

One way to prevent a reverse voltage from being applied to an electric load is to connect a diode in a series-type configuration between the electric load and the power source. However, for high-powered loads (e.g., greater than 10 amps), the power loss across the diode generates heat and becomes a thermal concern. To address such concerns, a MOSFET can be used to prevent a reverse voltage from being applied to the load.

Figure 1:
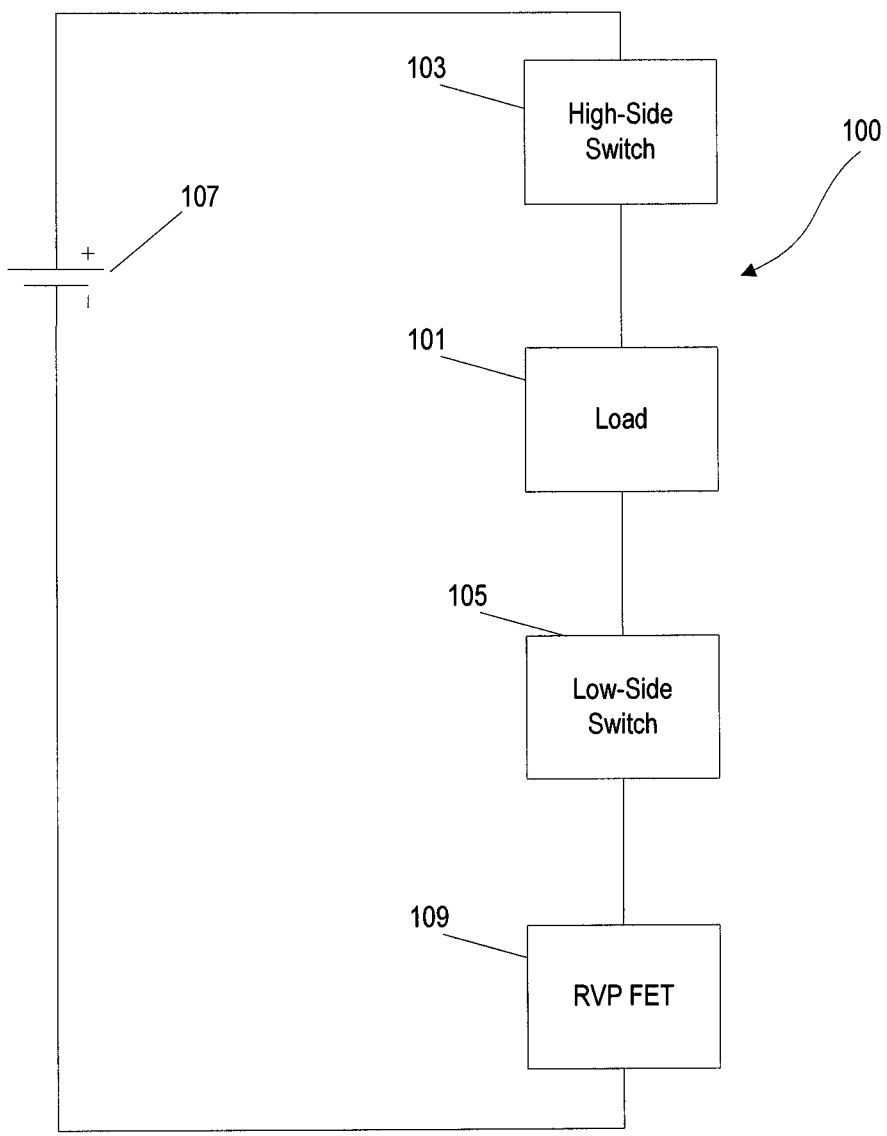
FIG. 1 is a block diagram of an electrical system with a reverse-voltage protection system.

FIG. 1 illustrates one example of a high-power electrical system that includes a reverse-voltage protection system. The electrical system 100 includes an electric load 101. A high-side switch 103 and a low-side switch 105 control the load 101 by selectively connecting the load 101 to a power source 107. A reverse-voltage protection (RVP) switch 109 is connected in a series-type configuration between the low-side switch 105 and the power source 107.

The phrase "series-type configuration" as used herein refers to a circuit arrangement where the described elements are arranged, in general, in a sequential fashion such that the output of one element is coupled to the input of another, but the same current may not pass through each element. For example, in a "series-type configuration," it is possible for additional circuit elements to be connected in parallel with one or more of the elements in the "series-type configuration." Furthermore, additional circuit elements can be connected at nodes in the series-type configuration such that branches in the circuit are present. Therefore, elements in a series-type configuration do not necessary form a true "series circuit." As a further illustration, the elements 401, 403, 405, and 409 of FIG. 4 (discussed in detail below) are connected in a series-type configuration.

Figure 2:
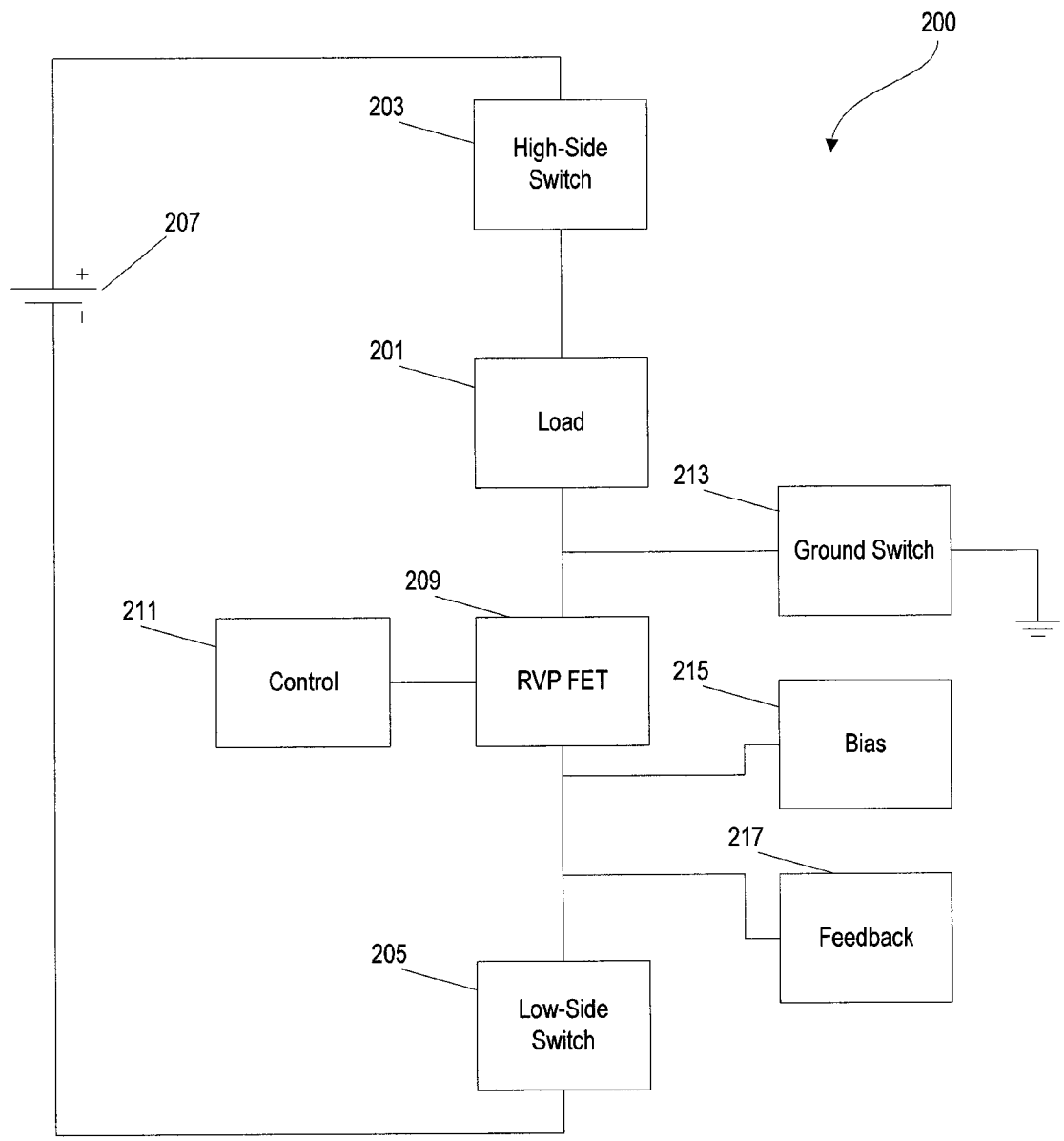
FIG. 2 is a block diagram of another electrical system with a different reverse-voltage protection system.

In the example of FIG. 1, the RVP switch includes a field-effect transistor (FET). The RVP switch 109 is either non-switchable or permanently held in the closed position. This arrangement allows current to flow in the intended direction, but prevents current flow when a battery or other power source is connected backwards. A draw-back of the electrical system illustrated in FIG. 1 and other more basic reverse-voltage protection circuits are that problems with the circuit that may disable or hinder its functionality cannot be reliably diagnosed. FIG. 2 illustrates another electrical system that includes on-circuit elements that enable reliable detection of fault conditions in the reverse-voltage protection circuit.

Like the system of FIG. 1, the electrical system 200 of FIG. 2 includes a high-power electrical load 201. A high-side control switch 203 and a low-side control switch 205 control the operation of the load 201 by selectively connecting the load 201 to a power source 207. However, in this example, the reverse-voltage protection switch 209 is connected in a series-type configuration between the electric load 201 and the low-side switch 205. The RVP switch 209 is a controllable switch including a first terminal, a second terminal, and a control terminal. The RVP switch 209 opens and closes based on an input provided to the control terminal allowing or preventing current flow between the first and second terminals. In the example illustrated below, the RVP switch 209 is shown as a field-effect transistor (FET) and, therefore, the first and second terminals are referred to as source and drain terminals, respectively. However, the RVP switch 209 can be implemented using other controllable switches in other constructions.

Additional components are incorporated into the electrical system including a controller or control system 211 for controlling the state of the RVP switch 209, a ground switch 213 for selectively connecting the source terminal of the RVP switch 209 to ground, a bias voltage source 215 for selectively applying a bias voltage to the drain terminal of the RVP switch 209, and a feedback system 217 for measuring the voltage at the drain terminal of the RVP switch 209. In some constructions, the ground switch 213, the bias voltage source 215, and the feedback system 217 are all operated or monitored by the control system 211. The control system 211 includes a processor and a memory for storing executable instructions for controlling the operation of the system (for example, according to the process illustrated in FIG. 3). In other embodiments, the control system can be implemented in other ways such as, for example, and ASIC or an analog control circuit.

In the example of FIG. 2, all of the illustrated components are integrated into the printed circuit board (PCB) or integrated circuit (IC) of the electrical system. The PCB or IC is then encased within a housing. Therefore, the system is able to perform self-diagnostics and alert a user to an error condition. In other constructions, it is possible that these components provide accessible access ports so that the circuit can be manipulated by an external system or component to perform diagnostic functions.

Figure 3:
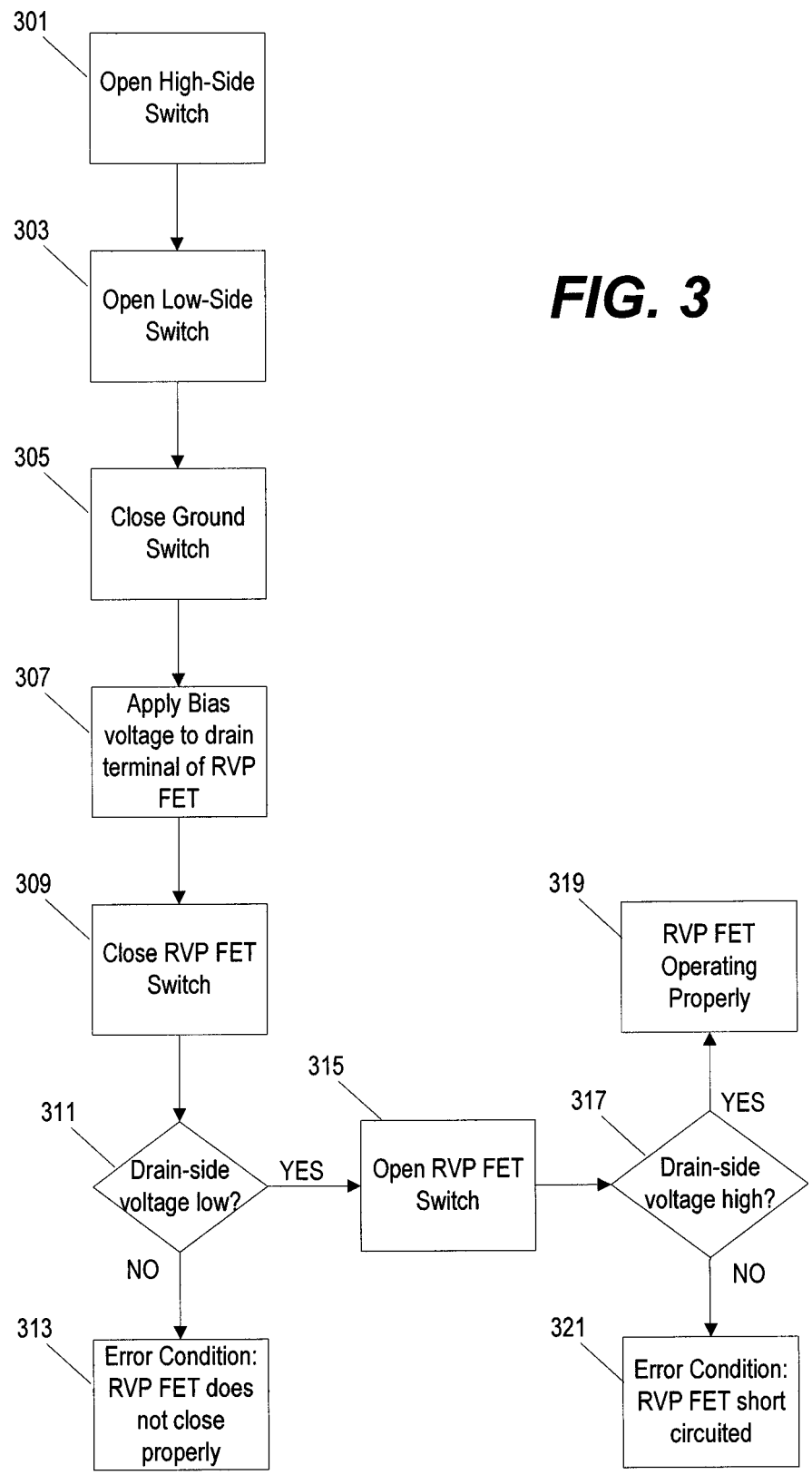
FIG. 3 is a flow chart illustrating a method for diagnosing error conditions in the reverse-voltage protection system of the electric system of FIG. 2.

FIG. 3 illustrates a method of diagnosing the RVP switch 209 in the electrical system of FIG. 2. This method is automatically initiated by the control system 211 at regular intervals. However, in other constructions, the diagnostic method is initiated by a user input or when the electric system 200 is connected to an external diagnostic system.

To perform the diagnostic method, the high-side switch and the low-side switch are both opened (steps 301 and 303) disconnecting the electrical load 201 from the power source 207. The ground switch 213 is closed to connect the source terminal of the RVP switch 209 to ground (step 305). A bias voltage from the bias voltage source 215 is then applied to the drain terminal of the RVP switch 209 (step 307).

The diagnostic method then performs two checks for error conditions. First, the RVP switch 209 is closed (step 309) and the feedback system 217 measures the voltage at the drain terminal of the RVP switch 209 (step 311). Under normal operating conditions, closing the RVP switch 209 connects the biasing voltage to ground through the ground switch 213. Therefore, a low voltage should be detected at the drain terminal (e.g., zero volts or a voltage lower than a threshold). However, if the RVP switch 209 is unable to properly close, an improper "open-circuit" condition is present and the voltage at the drain terminal will remain high (e.g., equal to the bias voltage or greater than a threshold). If the voltage at the drain terminal is high, the system indicates an error condition (step 313). If the voltage is low, the system proceeds to the second test.

The second diagnostic test checks for a short-circuit condition in the RVP switch 209. The RVP switch 209 is opened (step 315). The ground switch 213 remains closed while the high-side switch 203 and the low-side switch 205 remain open. The feedback system 217 again measures the voltage at the drain terminal of the RVP switch 209. Under normal operating conditions, opening the RVP switch 209 disconnects the biasing voltage from ground. Therefore, a high voltage should be detected at the drain terminal (e.g., a voltage equal to the bias voltage or greater than a threshold). However, if an improper short-circuit condition exists across the RVP switch 209, the bias voltage will remain connected to ground through the ground switch 213 and the voltage at the drain terminal will remain low (e.g., zero volts or a voltage less than a threshold). If the feedback system 217 measures a high voltage (step 317), the system concludes that the RVP switch 209 is operating properly or exhibits an error condition that cannot be diagnosed (step 319). If, however, the feedback system 217 measures a low voltage, the system concludes that there is a short-circuit in the RVP switch 209 and indicates an error condition (step 321).

Figure 4:
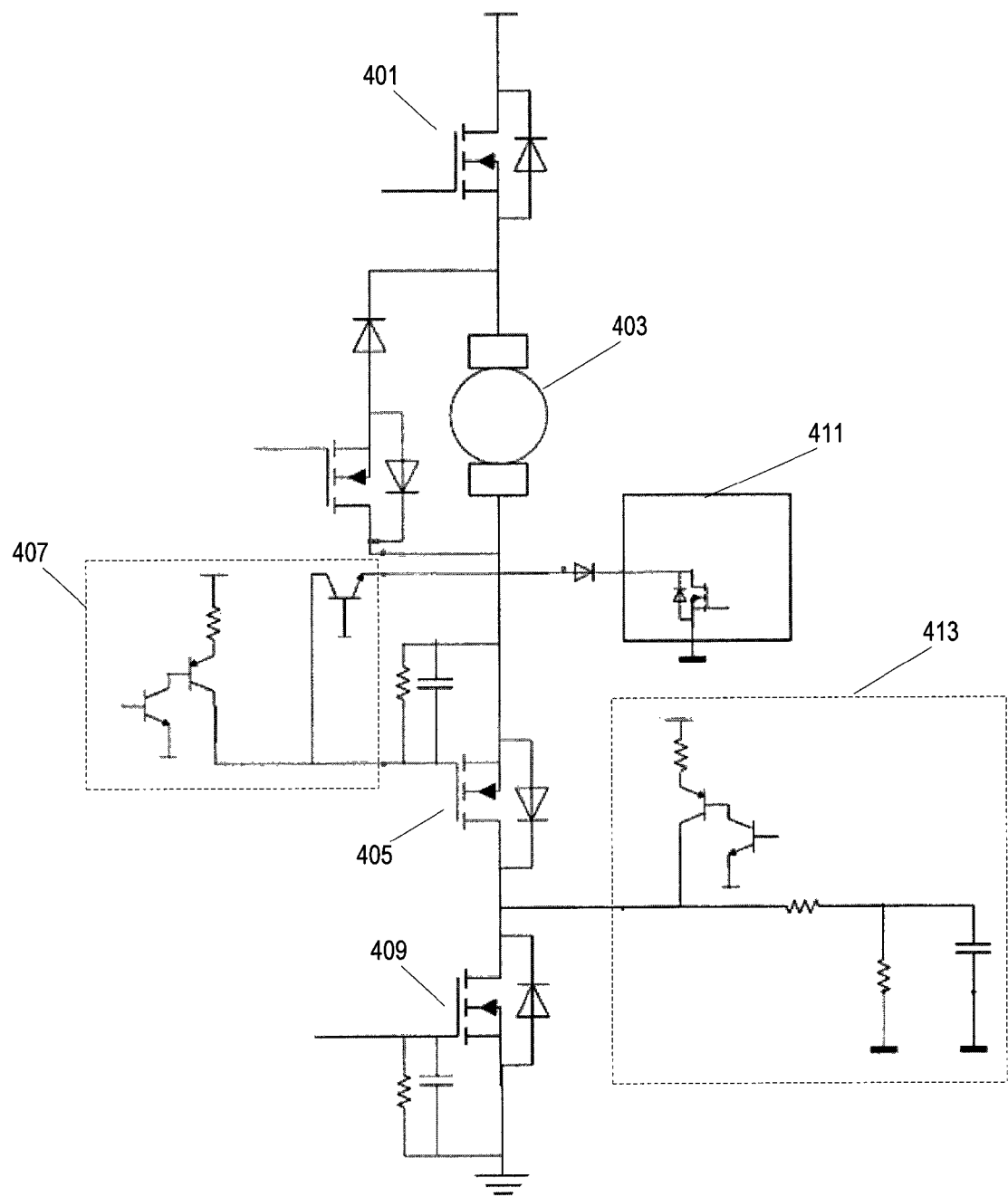
FIG. 4 is a schematic illustration showing additional circuit components of the electrical system of FIG. 2.

FIG. 4 is a circuit diagram illustrating one implementation of the system of FIG. 2. A controlled MOSFET 401 provides the high-side switching to control the electrical load 403. The RVP switch is also implemented as a controlled MOSFET 405. A series of transistors provide a control interface 407 for the RVP MOSFET 405. A third controlled MOSFET 409 provides the low-side switching. A fourth controlled switch 411 acts as a ground switch. In this example, the feedback system 413 includes nodes for providing the biasing voltage and measuring the voltage at the drain terminal of the MOSFET 405.

The examples provided above illustrate only some of the possible implementations of the invention defined in the claims. Other circuit arrangements and diagnostic methods are possible. Thus, the invention provides, among other things, an electrical system including reverse-voltage protection features and a mechanism for diagnosing error conditions of the reverse-voltage protection system. Various features and advantages of the invention are set forth in the following claims.

What is claimed is:

1. A method of monitoring operation of a reverse-voltage protection circuit in an electrical system, the system including
    an electric load and the reverse-voltage protection circuit in a series-type configuration with a power source, the reverse-voltage protection circuit including a reverse-voltage protection switch having a first terminal, a second terminal, and a control terminal, the first terminal being coupled to the electric load, the second terminal being coupled to the power source, the reverse-voltage protection switch opening and closing a connection between the first terminal and the second terminal based on an input to the control terminal, and
    a ground switch connected between the first terminal of the reverse-voltage protection switch and ground,
    the method comprising:
    disconnecting the second terminal of the reverse-voltage protection switch from the power source;
    closing the ground switch to connect the first terminal of the reverse-voltage protection switch to ground;
    applying a biasing voltage to the second terminal of the reverse-voltage protection switch;
    opening the reverse-voltage protection switch; and
    determining that an improper short-circuit condition exists across the reverse-voltage protection switch when the voltage at the second terminal of the reverse-voltage protection switch is less than a threshold while the second terminal of the reverse-voltage protection switch is disconnected from the power source, the ground switch is closed, the reverse-voltage protection switch is opened, and the bias voltage is applied to the second terminal of the reverse-voltage protection switch.

2. The method of claim 1, further comprising the acts of closing the reverse-voltage protection switch; and
    determining that an improper open-circuit condition exists across the reverse-voltage protection switch when then voltage at the second terminal of the reverse-voltage protection switch exceeds a threshold while the second terminal of the reverse-voltage protection switch is disconnected from the power source, the ground switch is closed, the reverse-voltage protection switch is closed, and the bias voltage is applied to the second terminal of the reverse-voltage protection switch.

3. The method of claim 1, wherein the electrical system further includes a low-side switch connected in a series-type configuration between the second terminal of the reverse-voltage protection switch and the power source, and wherein the act of disconnecting the second terminal of the reverse-voltage protection switch from the power source includes opening the low-side switch.

4. The method of claim 1, wherein the electrical system further includes
    a high-side switch connected in a series-type configuration between the power source and the electric load, the high-side switch controlling operation of the electric load by selectively connecting the electric load to the power source, and
    a low-side switch connected in a series-type configuration between the second terminal of the reverse-voltage protection switch and the power source.

5. The method of claim 4, wherein the act of disconnecting the second terminal of the reverse-voltage protection switch from the power source includes opening the low-side switch, and the method further comprising opening the high-side switch to disconnect the electric load from the power supply.

6. An electrical system comprising:
    an electric load;
    a power supply connected to the load;
    a reverse-voltage protection switch connected in a series-type configuration with the electric load and the power supply, the reverse-voltage protection switch including a first terminal, a second terminal, and a control terminal, the first terminal being coupled to the electric load, the second terminal being coupled to the power source, the reverse-voltage protection switch opening and closing a connection between the first terminal and the second terminal based on an input to the control terminal;
    a ground switch connected between the first terminal of the reverse-voltage protection switch and ground;
    a bias voltage source connected to the second terminal of the reverse-voltage protection circuit; and
    a control system configured to monitor the operation of the reverse-voltage protection switch by
        disconnecting the second terminal of the reverse-voltage protection switch from the power source;
        closing the ground switch to connect the first terminal of the reverse-voltage protection switch to ground;
        applying a biasing voltage to the second terminal of the reverse-voltage protection switch;
        opening the reverse-voltage protection switch; and
        determining that an improper short-circuit condition exists across the reverse-voltage protection switch when the voltage at the second terminal of the reverse-voltage protection switch is less than a threshold while the second terminal of the reverse-voltage protection switch is disconnected from the power source, the ground switch is closed, the reverse-voltage protection switch is opened, and the bias voltage is applied to the second terminal of the reverse-voltage protection switch.

7. The electrical system of claim 6, wherein the control system is further configured to
    close the reverse-voltage protection switch; and
    determine that an improper open-circuit condition exists across the reverse-voltage protection switch when then voltage at the second terminal of the reverse-voltage protection switch exceeds a threshold while the second terminal of the reverse-voltage protection switch is disconnected from the power source, the ground switch is closed, the reverse-voltage protection switch is closed, and the bias voltage is applied to the second terminal of the reverse-voltage protection switch.

8. The electrical system of claim 6, further comprising a low-side switch connected in a series-type configuration between the second terminal of the reverse-voltage protection switch and the power source, and wherein the control system is configured to disconnect the second terminal of the reverse-voltage protection switch from the power source by opening the low-side switch.

9. The electrical system of claim 6, further comprising
a high-side switch connected in a series-type configuration between the power source and the electric load, the high-side switch controlling operation of the electric load by selectively connecting the electric load to the power source, and
a low-side switch connected in a series-type configuration between the second terminal of the reverse-voltage protection switch and the power source.

10. The electrical system of claim 9, wherein the control system is configured to disconnect the second terminal of the reverse-voltage protection switch from the power source by opening the low-side switch, and is further configured to monitor the operation of the reverse-voltage protection switch by opening the high-side switch to disconnect the electric load from the power supply.

11. The electrical system of claim 9, wherein the reverse-voltage protection switch includes a field-effect transistor, the first terminal of the reverse-voltage protection switch includes a source terminal of the field-effect transistor, and the second terminal of the reverse-voltage protection switch includes a drain terminal of the field-effect transistor.

12. An electrical system comprising:
a power supply;
an electric load;
a high-side switch including a first terminal, a second terminal, and a control terminal, the high-side switch opening and closing a connection between the first terminal of the high-side switch and the second terminal of the high-side switch based on an input to the control terminal of the high-side switch, the high-side switch being connected between the power supply and the electric load in a series-type configuration such that the first terminal of the high-side switch is connected to the power supply and the second terminal of the high-side switch is connected to the electric load;
a reverse-voltage protection switch including a first terminal, a second terminal, and a control terminal, the reverse-voltage protection switch opening and closing a connection between the first terminal of the reverse-voltage protection switch and the second terminal of the reverse-voltage protection switch based on an input to the control terminal of the reverse-voltage protection switch, the reverse-voltage protection switch being connected between the electric load and a low-side switch such that the first terminal of the reverse-voltage protection switch is connected to the electric load and the second terminal of the reverse-voltage protection switch is connected to the low-side switch;
the low-side switch including a first terminal, a second terminal, and a control terminal, the low-side switch opening and closing a connection between the first terminal of the low-side switch and the second terminal of the low-side switch based on an input to the control terminal of the low-side switch, the low-side switch being connected between the reverse-voltage protection switch and the power supply in a series-type configuration such that the first terminal of the low-side switch is connected to the reverse-voltage protection switch and the second terminal of the low-side switch is connected to the power supply;
a ground switch including a first terminal, a second terminal, and a control terminal, the ground switch opening and closing a connection between the first terminal of the ground switch and the second terminal of the ground switch based on an input to the control terminal of the ground switch, the first terminal of the ground switch being connected to the first terminal of the reverse-voltage protection switch and the second terminal of the ground switch being connected to ground;
a bias voltage source connected to the second terminal of the reverse-voltage protection switch;
a voltage measuring circuit connected to the second terminal of the reverse-voltage protection switch; and
a control system connected to the control terminal of the high-side switch, the control terminal of the reverse-voltage protection switch, the control terminal of the low-side switch, and the control terminal of the ground switch, and configured to
control operation of the electric load by selectively opening and closing the high-side switch and the low-side switch,
monitor operation of the reverse-voltage protection switch by
opening the low-side switch to disconnect the second terminal of the reverse-voltage protection switch from the power supply;
opening the high-side switch to disconnect the electric load from the power supply;
closing the ground switch to connect the first terminal of the reverse-voltage protection switch to ground;
activate the bias voltage source to apply a bias voltage to the second terminal of the reverse-voltage protection switch;
opening the reverse-voltage protection switch; and
determining that an improper short-circuit condition exists across the reverse-voltage protection switch when the voltage at the second terminal of the reverse-voltage protection switch is less than a threshold while the high-side switch is open, the low-side switch is open, the ground switch is closed, the reverse-voltage protection switch is opened, and the bias voltage is applied to the second terminal of the reverse-voltage protection switch.

* * * * *